United States Patent
Radtke et al.

(10) Patent No.: US 8,681,376 B2
(45) Date of Patent: Mar. 25, 2014

(54) PRODUCTION OF TEST PRINTS

(75) Inventors: David Radtke, Tübingen (DE); Jürgen Wurster, Dettenhausen (DE)

(73) Assignee: GMG GmbH & Co. KG, Dettenhausen (DE)

(*) Notice: Subject to any disclaimer, the term of this patent is extended or adjusted under 35 U.S.C. 154(b) by 635 days.

(21) Appl. No.: 12/989,398

(22) PCT Filed: Apr. 22, 2009

(86) PCT No.: PCT/EP2009/002927
§ 371 (c)(1),
(2), (4) Date: Jan. 21, 2011

(87) PCT Pub. No.: WO2009/130013
PCT Pub. Date: Oct. 29, 2009

(65) Prior Publication Data
US 2011/0109928 A1    May 12, 2011

(30) Foreign Application Priority Data
Apr. 22, 2008 (EP) ..................................... 08007753

(51) Int. Cl.
*H04N 1/60* (2006.01)

(52) U.S. Cl.
USPC .......... 358/1.9; 358/1.13; 358/1.15; 358/1.16; 358/2.1

(58) Field of Classification Search
USPC ............... 358/1.9, 1.14, 517, 518, 1.13, 1.15, 358/1.16, 2.1
See application file for complete search history.

(56) References Cited

U.S. PATENT DOCUMENTS 5,333,069 A * 7/1994 Spence .......................... 358/517
6,639,688 B2 * 10/2003 Imai .............................. 358/1.14

(Continued)

FOREIGN PATENT DOCUMENTS

EP    1231774 A3    5/2005
EP    1648157 A1    4/2006

(Continued)

OTHER PUBLICATIONS

"GMG InkOptimizer", GMG Reports Successful First Half of 2004, XP-002324907, 2004, 3 pages.

*Primary Examiner* — Allen H Nguyen
(74) *Attorney, Agent, or Firm* — Ohlandt, Greeley, Ruggiero & Perle, L.L.P.

(57) ABSTRACT

In order to improve a method for producing test prints such that the same results in reproducible test prints in a narrow deviation spectrum at high accuracy with the highest possible print flexibility, the invention provides a method for the production of test prints (proofs) of print data intended for printing on an industrial printing machine on a digital printer, wherein the print data is converted from a color space for any given industrial printing machine into digital proof print data in a color space for any given digital printer, as a function of a given state based on conversion tables, wherein the given state comprises parameters, such as paper type, ink, printing mode, and wherein conversion data is determined and considered during the printing process for a calibration file for the printer based on data compatible with the color space, by means of printing a test image, measuring the same, and comparing the same to a typical printer target image, wherein parameters dependent on a measuring device utilized during the measuring of the test image are considered during the determination of the correction data.

6 Claims, 1 Drawing Sheet

Figure 1:
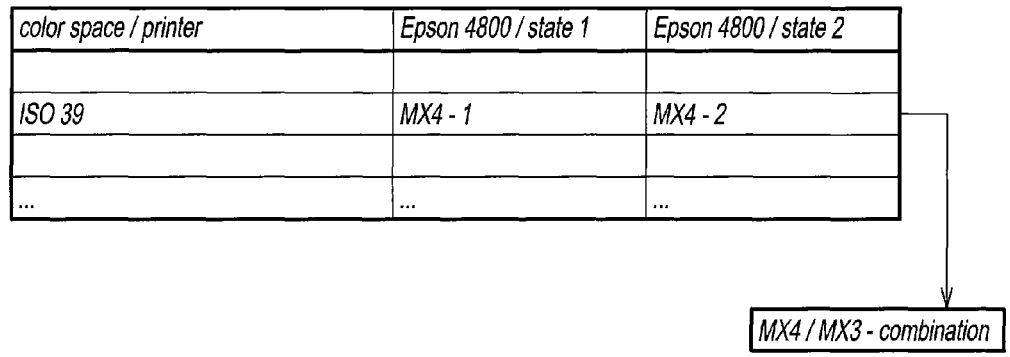

| color space / printer | Epson 4800 / state 1 | Epson 4800 / state 2 |
|---|---|---|
|  |  |  |
| ISO 39 | MX4 - 1 | MX4 - 2 |
|  |  |  |
| ... | ... | ... |

MX4 / MX3 - combination

(56) References Cited

U.S. PATENT DOCUMENTS

| | | |
|---|---|---|
| 6,954,227 B2 | 10/2005 | Yoda |
| 7,154,634 B2 * | 12/2006 | Hung ............................ 358/1.9 |
| 7,321,448 B2 | 1/2008 | Nishida et al. |
| 8,472,068 B2 * | 6/2013 | Kurokawa .................... 358/1.18 |
| 2004/0201211 A1 * | 10/2004 | Weiss ........................... 283/114 |
| 2004/0201696 A1 | 10/2004 | Yoda ........................ 348/207.99 |
| 2007/0097412 A1 * | 5/2007 | Peiro et al. .................. 358/1.14 |
| 2009/0091779 A1 * | 4/2009 | Ishinaga et al. ............. 358/1.15 |
| 2009/0290171 A1 * | 11/2009 | Albat et al. ................... 358/1.9 |

FOREIGN PATENT DOCUMENTS

| | | |
|---|---|---|
| EP | 1039743 A1 | 4/2007 |
| EP | 2012525 A2 | 1/2009 |
| JP | 10114128 | 5/1998 |
| JP | 10114128 A * | 5/1998 |
| JP | 2006209407 | 8/2006 |
| JP | 2007060396 A | 3/2007 |
| WO | WO 02/30103 A1 | 4/2002 |
| WO | WO 2007/093441 A1 | 8/2007 |
| WO | WO2007093411 | 8/2007 |

* cited by examiner

PRODUCTION OF TEST PRINTS

The present invention relates to a method for the production of test prints, so called proofs.

Industrial printing machines can usually print a certain spectrum of colors and black color using standardized papers and print colors. This printing range that can be usually represented is designated as so called color space. Any combination of the predetermined print colors, respectively in a spectrum comprised between 0% and 100%, including black color, leads to a printable color point.

Depending on the resolution, digital print data define the color point to be respectively printed in the color space. Color spaces are for example ISO color spaces for the offset printing (e.g. ISO 39), PSR color spaces which are used in the intaglio range, web coating color spaces which are for example used for the web-fed offset and the like.

In order to be able to check the quality of a layout, it would be normally required to set and to put the corresponding printing machine in operation, in order to print out a corresponding image for checking the result. For reducing this extremely high economic effort, it is meanwhile known to print out test prints on comparatively low-priced digital printers.

The respective digital printer, as far as it is concerned, can realize another color spectrum in comparison to the industrial printing machine.

This color space of the digital printer will result, if the colors as well as black color available with this digital printer are printed in all combinations. Herein, one also proceeds from standard colors which are common of this printer or printer type and standard papers for digital printers.

The comparison of both color spaces leads to conversion tables, such that a certain color in the color space of the industrial printing machine can be clearly pictured at a certain point in the color space of the digital printer.

Such methods are known and for example described in WO 2007/093411.

After the conversion of the print data from one color space into another, the test image could now be printed on the digital printer.

However, it is known that there are parameters which modify the standard conditions such that so called calibrations with respect to the concrete digital printer will be required. Such modifications for example concern the color place which changes, e.g. caused by production tolerances of the colors and the paper. The color absorption behavior of papers also varies and the mechanics of the printer and the printer head are subject to certain wear symptoms.

Instead of adapting conversion tables, one speaks of so called profiles, calibration tables are used. These ones are applied to the color space converted data, in order to adapt the data to the concrete state of the present digital printer.

The calibration is usually realized such that a test image or a test strip is printed which pictures certain color fields. The concretely printed result is compared to a target image that is typical of a printer. For this, an exact measurement of the printed test strip is carried out and the resulting data are compared to the nominal data. The corresponding variations lead to calibration data which will then be used in a completing or overlaying manner in the respective calibration table.

In practice it has now been found out that the use of the methods described with respect to the state of the art still produces deviations, such that the results are subject to high variations. The results cannot always be arbitrarily reproduced and the accuracy of the creation of the calibration data leaves much to be desired.

Based upon the previously described state of the art it is the object of the present invention to improve a method for the production of test prints in such a way that this one provides reproducible test prints in a narrow spectrum of deviations with a high accuracy and as high printing flexibility as possible. Simultaneously, the security of the use of the method software is clearly increased in that logic links in the software compensate user mistakes.

For the technical solution of this problem the invention proposes a method comprising the characteristics of claim 1. Other advantages and characteristics of the invention will become apparent in the sub-claims.

According to the invention, the print data which are present in a pre-determined color space are transformed into the color space of the digital printer using conversion tables. Herein, a given standard state of the digital printer is assumed. Thus, for example certain paper types can lead to different base states and consequently to different color space transformation tables or color space conversion tables.

The transformed data will now be edulcorated by means of correction data. The correction data, as far as they are concerned, are the result of a so called calibration. Herein, a pre-determined color spectrum will be printed out by the digital printer, the print result will be measured and compared to a nominal result.

For the measurement, different measuring devices are available in the state of the art. It has been found that the respective choice of the measuring device has an influence on the calibration results.

During the calibration it is thus also taken into account according to the invention which measuring device is used, in order to considerably increase the accuracy of the data in this way. This is realized in an automatized manner.

It has been found that already this supplementary state definition entails a considerable improvement of the results.

Herein, it is important that the calibrations of the different measuring devices are now collected in a set and the set can be provided with tolerances. One speaks of a "calibration set".

With modern measuring devices it is possible that the computer which is respectively used for the calibration directly queries the type of measuring device. Thereby, the method is largely automatized with respect to this point.

According to an advantageous proposal of the invention, the respective color strip to be printed for the calibration, which is also called test strip, test image or the like, already considers the respective measuring device. In this way, test strips can be pre-determined which have to be respectively used according to the measuring device. Thus, the test data record to be printed is as clearly defined as the nominal data record to be compared to the measuring result. After having queried the present measuring device, these data can be automatically selected. This means that the nominal values of the different measuring devices are different, but all lead to the identical calibration result.

On the base of the deviations which result during the calibration, the system can in the first instance check the correctness of the settings in a simple manner.

Usually, the system automatically recognizes which measuring device is connected, but printers also provide information about ink sets in use and the like. The system is for example able to recognize that the wrong paper is inserted into the printer or it can easily recognize that the printed results deviate according to the variance comparison in such a way that a calibration is required. The calibration can either be triggered automatically or be prepared by a message.

Advantageously, the invention permits to realize validity checks with respect to the calibration data. This can be for example settable, for instance in the sense of "at each print job", "every X print jobs", every X hours, every X days, etc.

Herein, there are two possibilities of the validity check:
1) The validity check is carried out with the entire test chart which is also used for the calibration.
2) The validity check is carried out with a test chart which comprises a suitable selection of the test chart fields of the calibration test chart. Thus a "quick test" can be carried out.

The tolerances for the calibration results are linked to the nominal values. Tolerances and validity checks can be defined for each calibration set. Thus, more exacting tolerances can be for example defined for a high quality paper than for a paper of lower quality. In particular, also a sort of expiration period for the calibration result can be set, such that for example after a certain period of time, for instance one week, the calibration data automatically become invalid.

Thanks to this complement according to the invention, a very high production security is achieved, since the validity criteria assure that the calibration data currently correspond to the actual state. Print head wear, wear of the mechanics, the guides and the like, but also changes of the color absorption behavior of the paper, the changes of the color places and the like have hardly any impact any more. Furthermore, the system does not allow that jobs are output in a non calibrated manner, whereby the security for the user is clearly increased.

According to the invention, a spectrum of tolerances can be defined, in which deviations resulting from the variance comparison can be comprised. Thus, one can leave it to the user to also allow a higher deviation than acceptable or the spectrum can be automatically checked by the software.

Advantageously, the deviations with respect to the nominal values are also printed as text labels on the proof. Thus, the user can exactly determine for the respective print in which conditions the print has been realized. Furthermore, the date of the last calibration will be noted on the proof. Besides, it will be noted which calibration set has been used, which in turn clearly defines the nominal values as well as the tolerances and validity parameters. Having this information the user can easily see whether the technical parameters of the proof including calibration are o.k. Gross user mistakes or negligence (the user has not calibrated the printer for a long time) can be directly recognized by means of the label.

Another special advantage of the invention results from the fact that combinations of transformation tables and calibration files having the same result are allocated to a standard selection. In this way, it is possible to realize a load balancing, so far as several different printers are present.

The initial point of the production of test prints or proofs is always that the operator of course knows in which color space of which industrial printing machine type a print shall be finally produced. Furthermore, the user or the system obviously knows which digital printers are available with which states and modi.

Furthermore, thanks to the validity dependent calibration it is known to the system which respective results will be obtained.

In this way, the system is able to evaluate the respective results for combinations of transformation tables and calibration files and to simultaneously find out combinations which have the same results.

Thus, a printer of a selection can be for example offered to the user automatically or for selection, if this printer supplies the same results as another printer of a standard selection. In this way, printing can be realized with high flexibility and a so called load balancing automatically results. This means that the available printers are essentially loaded in an equal manner. Furthermore, the system does not permit to output jobs in a non calibrated manner. Thus, only calibrated printers are involved in the load balancing.

According to the invention, it is advantageously provided to print out a completeness information item with the proof. Advantageously, this one is a logo. If all the parameters are valid, i.e. if the transformation file for the color space transformation of the data and the calibration file are applied, the calibration file is valid and all parameters that can be checked are in the predetermined range, a complete logo will be printed. According to the invention, it can be provided to not print certain areas of the logo, for example if certain conditions are not met. This can be for instance a certain color range which is omitted, such that others, for instance red color, become more dominant. It is also possible to shift colors instead of omitting some parts and to print out the logo correspondingly. A for example only red logo indicates that on the base of the pre-determinations this print should not be o.k.

It is also known to the man skilled in the art to use a so called ICC standard. This one is an internationally defined standard based upon CieL*a*b values. For a color space concerning the printing machine, for instance ISO 39, there is thus a conversion table, by means of which the values of the ISO color space are converted into the CieL*a*b values of the ICC color space. There are also corresponding look-up tables or conversion tables, by means of which the ICC CieL*a*b values are converted into values in the color space of the digital printer. Thus, there is no direct transfer from ISO into the color space of the digital printer, but the values are transferred via the deviation of the CieL*a*b color space of the ICC standard. In the state of the art one has proceeded in such a way that in this case, if there were deviations, the conversion table of ICC to digital printer was newly created. Now, the invention enables to create such a base table which will then be completed in the way according to the invention by a calibration table or a calibration set. Hereby, it becomes possible to use the advantages of the invention also with profiles of the international ICC standard.

The invention provides a considerably improved method for the production of test prints, so called color proofs, which increases the production security in such a way that the reproduction of prints is clearly more assured, which considerably increases the accuracy of the reproduction in the proof and furthermore improves the flexibility with respect to the printing process.

Figure 2:
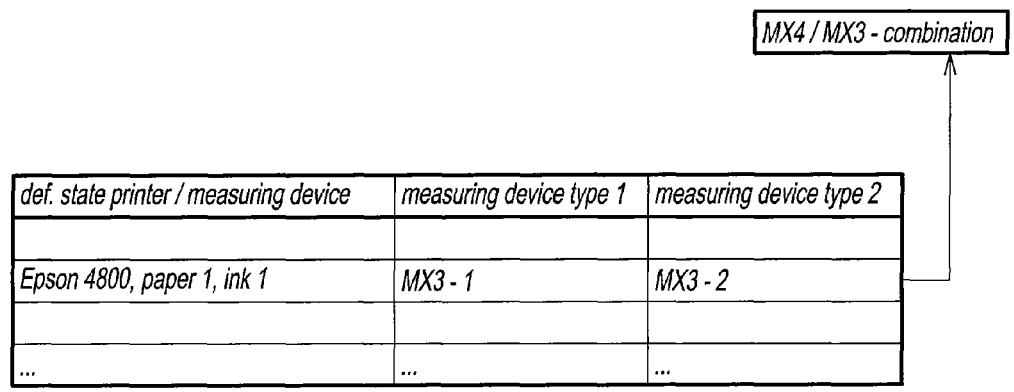

Other advantages and characteristics of the invention will become apparent in the following description by means of the figures. Herein:

FIG. 1 shows an allocation of the starting color space to the target color space and FIG. 2 shows an allocation of the defined printer state to the measuring device.

The starting point is a data record which comprises the digital print data for the creation of a print result on an industrial printing machine. These data aim at data points in the starting color space of the printing machine. Such a starting color space is for instance ISO 39.

A user wants to create a color proof on an existent digital printer, for instance an EPSON 4800 was chosen.

This EPSON 4800 can be used in different states, such that different allocation tables, designated as MX4, result.

Thus, a user selects his starting color space and the respective printer in the desired state. Then, a transformation of the digital print data from the starting color space into the target color space takes place using the respectively associated MX4 table.

The printer EPSON 4800 was for instance calibrated in state 1, provided with paper 1 and ink type 1. Depending on the used measuring device, a calibration file—in FIG. 2 designated as MX3—was created.

Proceeding on the assumption that the MX3 tables are respectively valid, the user can now select a MX4/MX3 combination in a simple manner and print out very precise reproducible results.

MX4/MX3 combinations which lead to the identical output result will be recognized by the system and, if necessary, it will be offered to the user to achieve the same target result also on another printer. In this way, it is possible to obtain a load balancing.

The described exemplary embodiments only serve for explanation and are not limiting.

The invention claimed is:

1. A method for the production of test prints of print data intended for printing on an industrial printing machine on a digital printer, wherein the print data are converted from a color space for an industrial printing machine into digital proof print data in a color space for a digital printer, as a function of a given state, with conversion tables,
   wherein the given state comprises parameters selected from the group consisting of paper type, ink, printing mode, and any combinations thereof,
   wherein calibration data are determined during the printing process for a calibration file for the printer based on data compatible with the color space, by printing a test image, measuring the test image, and comparing the test image to a printer target image,
   wherein parameters dependent on a measuring device used during the measuring of the test image are considered during the determination of the calibration data,
   wherein the calibration data are subjected to a validity check, with a period for carrying out the validity check that is predetermined,
   wherein a period of validity is determined for the calibration data, after which the calibration data automatically become invalid, and
   wherein a quality logo is printed out on the test print.

2. The method of claim 1, wherein the test image to be printed as well as the nominal values are selected as a function of the used measuring device.

3. The method of claim 1, wherein the correction data is provided with a tolerance spectrum.

4. The method of claim 1, wherein the printer prints out a text on the proof, in which deviations with respect to nominal values are contained.

5. The method of claim 1, wherein combinations of conversion tables and calibration files having the same result are allocated to a standard selection.

6. The method according of claim 5, characterized in that different printers of the standard selection are made available for selection for a load balancing.

* * * * *